United States Patent
Kang et al.

(10) Patent No.: US 12,249,993 B2
(45) Date of Patent: Mar. 11, 2025

(54) ASYMMETRIC NAND GATE CIRCUIT, CLOCK GATING CELL AND INTEGRATED CIRCUIT INCLUDING THE SAME

(71) Applicant: SAMSUNG ELECTRONICS CO., LTD., Suwon-si (KR)

(72) Inventors: Byounggon Kang, Suwon-si (KR); Dalhee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/373,017

(22) Filed: Sep. 26, 2023

(65) Prior Publication Data

US 2024/0137012 A1   Apr. 25, 2024
US 2024/0235533 A9   Jul. 11, 2024

(30) Foreign Application Priority Data

Oct. 24, 2022 (KR) .................. 10-2022-0137767
Feb. 14, 2023 (KR) .................. 10-2023-0019542

(51) Int. Cl.
   *H03K 3/037*  (2006.01)
   *G06F 1/08*   (2006.01)
   *H03K 3/012*  (2006.01)
   *H03K 19/20*  (2006.01)

(52) U.S. Cl.
   CPC .............. *H03K 3/037* (2013.01); *G06F 1/08* (2013.01); *H03K 19/20* (2013.01); *H03K 3/012* (2013.01)

(58) Field of Classification Search
   CPC ........ H03K 3/037; H03K 19/20; H03K 3/012; H03K 19/0016; G06F 1/08
   See application file for complete search history.

(56) References Cited

U.S. PATENT DOCUMENTS 9,291,674 B1 *  3/2016  Lu ...................... G01R 31/3177
9,564,897 B1    2/2017  Berzins et al.
9,762,240 B2 *  9/2017  Hwang .............. H03K 19/0013
(Continued)

FOREIGN PATENT DOCUMENTS

KR   10-2017-0000024 A   1/2017
KR   10-2017-0027249 A   3/2017
(Continued)

OTHER PUBLICATIONS

Partial European Search Report dated Apr. 8, 2024, issued by the European Patent Office in European Application No. 23204787.8.

*Primary Examiner* — John W Poos
(74) *Attorney, Agent, or Firm* — Sughrue Mion, PLLC

(57) ABSTRACT

A clock gating cell is provided. The clock gating cell includes: an inverter circuit configured to generate an inverted clock signal by inverting a clock signal; a first control circuit configured to receive the inverted clock signal, an enable signal, and a scan enable signal, and output a first internal signal at a first node; a second control circuit configured to receive the first internal signal, the clock signal, the enable signal, and the scan enable signal, and output a second internal signal at a second node; and an output driver configured to receive the second internal signal, and output an output clock signal to an output node and a third internal signal to a third node. The first control circuit and the second control circuit are configured to receive the third internal signal at the third node.

20 Claims, 11 Drawing Sheets

(56) References Cited

U.S. PATENT DOCUMENTS

| | | |
|---|---|---|
| 10,944,401 B1 | 3/2021 | Kim |
| 11,336,269 B2 | 5/2022 | Lee et al. |
| 2016/0179074 A1 | 6/2016 | Kim |
| 2016/0211846 A1 | 7/2016 | Rasouli et al. |
| 2018/0167058 A1 | 6/2018 | Rasouli et al. |
| 2018/0364781 A1 | 12/2018 | Schreiber |
| 2019/0028091 A1 | 1/2019 | Baratam et al. |
| 2019/0074825 A1 | 3/2019 | Hwang et al. |
| 2019/0173472 A1 | 6/2019 | Kim et al. |
| 2021/0143820 A1* | 5/2021 | Lee ........................ H03K 3/037 |

FOREIGN PATENT DOCUMENTS

| | | |
|---|---|---|
| KR | 10-2017-0043995 A | 4/2017 |
| KR | 10-2021-0037927 A | 4/2021 |
| KR | 10-2021-0051520 A | 5/2021 |

* cited by examiner

ASYMMETRIC NAND GATE CIRCUIT, CLOCK GATING CELL AND INTEGRATED CIRCUIT INCLUDING THE SAME

CROSS-REFERENCE TO RELATED APPLICATION

This application claims priority to Korean Patent Application Nos. 10-2022-0137767, filed on Oct. 24, 2022, and 10-2023-0019542, filed on Feb. 14, 2023, in the Korean Intellectual Property Office, the disclosures of which are incorporated by reference herein in their entireties.

BACKGROUND

The present disclosure relates to a clock gating cell, and more particularly, to a clock gating cell having low power and an integrated circuit including the same.

An integrated circuit that processes digital signals may operate in synchronization with a clock. For example, an integrated circuit may include a digital circuit that generates an output signal by processing an input signal in response to rising and/or falling edges of a clock, and when a clock edge does not occur, the operation of the digital circuit may be stopped. Clock gating may refer to stopping or resuming an operation of a digital circuit by selectively providing a clock, and power consumed by the digital circuit may be reduced by clock gating because the operation of the digital circuit is not continuously performed.

The integrated circuit may include a clock gating circuit (i.e., clock gating cell) that selectively outputs a clock according to a control signal, and the clock gating circuit may be required to interrupt and resume supply of the clock to prevent malfunction of the digital circuit receiving the clock.

SUMMARY

One or more example embodiments provide a clock gating cell capable of high-speed operation with improved setup rise characteristics between an enable signal and a clock signal, and an integrated circuit including the same.

According to an aspect of an example embodiment, a clock gating cell includes: an inverter circuit configured to generate an inverted clock signal by inverting a clock signal; a first control circuit configured to receive the inverted clock signal, an enable signal, and a scan enable signal, and output a first internal signal at a first node; a second control circuit configured to receive the first internal signal, the clock signal, the enable signal, and the scan enable signal, and output a second internal signal at a second node; and an output driver configured to receive the second internal signal, and output an output clock signal to an output node and a third internal signal to a third node. The first control circuit and the second control circuit are configured to receive the third internal signal at the third node.

According to another aspect of an example embodiment, an asymmetric NAND gate circuit includes: a first P-type transistor including a gate connected to a first node and a drain connected to a second node; a second P-type transistor including a gate to which a clock signal is input and a drain connected to the second node; a first N-type transistor, a second N-type transistor and a third N-type transistor that are connected to each other in parallel, each of the first N-type transistor, the second N-type transistor and the third N-type transistor including a drain connected to the second node; a fourth N-type transistor including a gate to which the clock signal is input and a drain connected to a source of the first N-type transistor; and a fifth N-type transistor including a gate connected to the first node and a drain connected to a source of the fourth N-type transistor.

According to another aspect of an example embodiment, an integrated circuit includes: a first clock gating cell configured to receive a clock signal and output a first output clock signal according to a first enable signal; and at least one first flip-flop configured to receive the first output clock signal. The first clock gating cell includes: an inverter circuit configured to invert the clock signal to generate an inverted clock signal; a first control circuit configured to receive the inverted clock signal, the first enable signal and a scan enable signal, and output a first internal signal; a second control circuit configured to receive the first internal signal, the clock signal, the first enable signal and the scan enable signal, and output a second internal signal; and an output driver configured to receive the second internal signal and output the first output clock signal to an output node. The output driver is configured to provide a third internal signal to the first control circuit and the second control circuit.

BRIEF DESCRIPTION OF DRAWINGS

The above and other objects and features will be more clearly understood from the following description of example embodiments, taken in conjunction with the accompanying drawings, in which.

DETAILED DESCRIPTION

Hereinafter, example embodiments will be described in detail with reference to the accompanying drawings. Each embodiment provided in the following description is not excluded from being associated with one or more features of another example or another embodiment also provided herein or not provided herein but consistent with the present disclosure. As used herein, the term "and/or" includes any and all combinations of one or more of the associated listed items. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In this specification, a logic high level '1' may correspond to a high voltage, for example a positive supply voltage (VDD) or a voltage close to a positive supply voltage and may be referred to as a high level or active state. The logic low level '0' may correspond to a low voltage, for example, a ground potential or a voltage close to the ground potential, and may be referred to as a low level or an inactive state. Also, in this specification, a ground node may refer to a node to which a ground potential (or negative supply voltage) is applied. In the specification, transistors may have any structure that provides complementary transistors (e.g., an n-channel transistor and a p-channel transistor), and as non-limiting examples, the transistors may be implemented as a Planar Field Effect Transistor (FET), a Fin Field Effect Transistor (FinFET), a Gate All Around Field Effect Transistor (GAAFET), a Vertical Field Effect Transistor (VFET), or the like.

Figure 1:
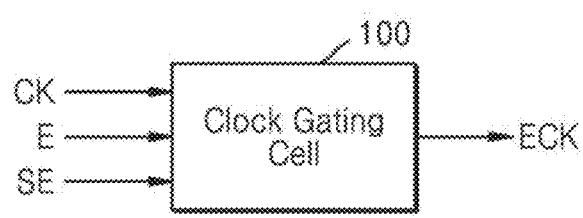
FIGS. 1 and 2 are block diagrams illustrating a clock gating cell according to an example embodiment.
Figure 2:
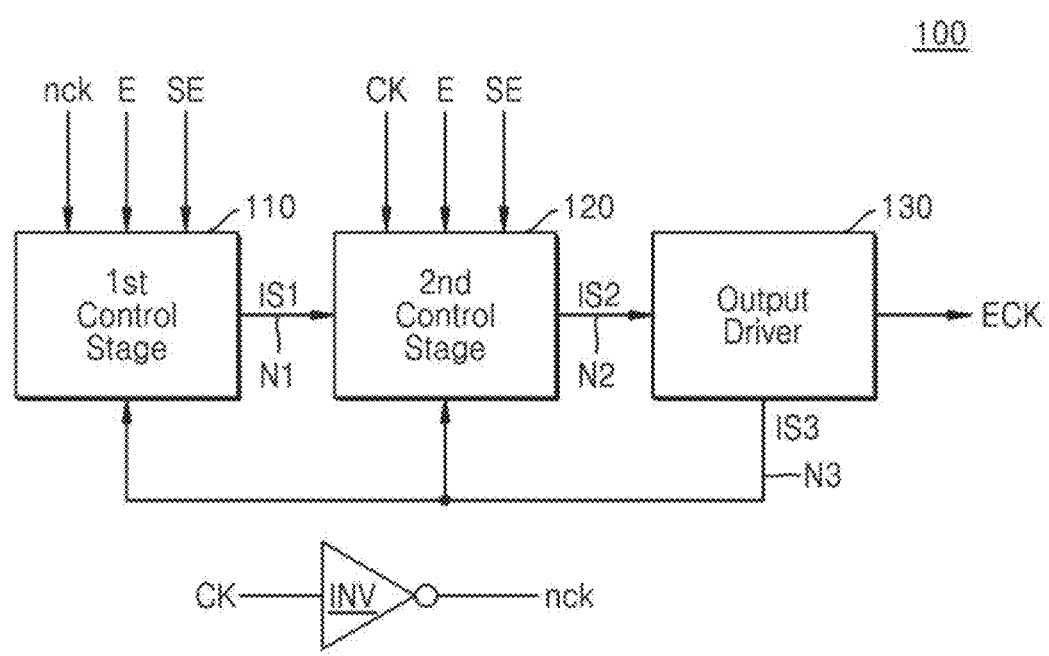

FIGS. 1 and 2 are block diagrams illustrating a clock gating cell 100 according to an example embodiment. The clock gating cell 100 may be included in an integrated circuit manufactured by a semiconductor process, and may be referred to as a clock gating circuit or an integrated clock gating cell.

Referring to FIG. 1, the clock gating cell 100 may generate an output clock signal ECK, which may be used for driving a plurality of load cells. The clock gating cell 100 may receive a clock signal CK, an enable signal E, and a scan enable signal SE, and generate an output clock signal ECK according to the clock signal CK, the enable signal E and the scan enable signal SE. The output clock signal ECK may toggle like the clock signal CK or maintained at a constant voltage level according to the enable signal E and the scan enable signal SE.

For example, the clock gating cell 100 may be in an enabled state in response to an activated enable signal E or an activated scan enable signal SE, and may generate an output clock signal ECK that toggles according to the clock signal CK in an enabled state. In addition, the clock gating cell 100 may be in a disabled state in response to the deactivated enable signal E and the deactivated scan enable signal SE, and may generate an output clock signal ECK having a constant level, for example, logic '1' or logic '0', in the disabled state. In this specification, the clock gating cell 100 in an enabled state may be referred to as supplying an output clock signal ECK, and the clock gating cell 100 in a disabled state and supplying the output clock signal ECK having the constant level may be referred to as not supplying the output clock signal ECK. That is, in the detailed description below, it may be explained that the output clock signal ECK is generated when the output clock signal ECK is generated to toggle like the clock signal CK, and it may be explained that the output clock signal ECK is not generated when the output clock signal ECK maintains a constant voltage level.

To prevent malfunction of the digital circuit receiving the output clock signal ECK, the clock gating cell 100 may stop or resume the supply of the output clock signal ECK in synchronization with the clock signal CK. In an example embodiment, the clock gating cell 100 may stop or resume supply of the output clock signal ECK in response to a rising edge of the clock signal CK, and the clock gating cell 100 may supply an output clock signal ECK to a digital circuit operating in response to the rising edge of the output clock signal ECK, for example, the clock gating cell 100 may include a positive edge triggered flip-flop. Also, in an example embodiment, the clock gating cell 100 may stop or resume supply of the output clock signal ECK in response to a falling edge of the clock signal CK, and the clock gating cell 100 may supply an output clock signal ECK to a digital circuit that operates in response to the falling edge of the output clock signal ECK, for example, the clock gating cell 100 may include a negative edge triggered flip-flop.

Referring to FIG. 2, the clock gating cell 100 may include a first control stage 110, a second control stage 120, and an output driver 130. The clock gating cell 100 may further include an inverter circuit INV generating an inverted clock signal nck by inverting the clock signal CK. The first control stage 110 may function as a latch and may perform a function of removing glitches. The second control stage 120 may function as a NAND gate circuit having an asymmetric structure and may be referred to as an asymmetric NAND gate circuit.

The first control stage 110 may generate a first internal signal IS1 provided to the first node N1 based on the inverted clock signal nck, the scan enable signal SE, the enable signal E, and the third internal signal IS3. The first control stage 110 may include a feedback path for feeding back the first internal signal IS1.

When at least one of the scan enable signal SE, the enable signal E, and the third internal signal IS3 is activated, the second control stage 120 may perform a NAND operation on the first internal signal IS1 and the clock signal CK. The second control stage 120 may generate a second internal signal IS2 provided to the second node N2 as a result of the NAND operation.

The output driver 130 may generate an output clock signal ECK based on the second internal signal IS2 and generate a third internal signal IS3 provided to the third node N3. For example, the output driver 130 may include a plurality of inverter circuits, invert the second internal signal IS2 and output the inverted second internal signal IS2 as the output clock signal ECK.

Figure 3:
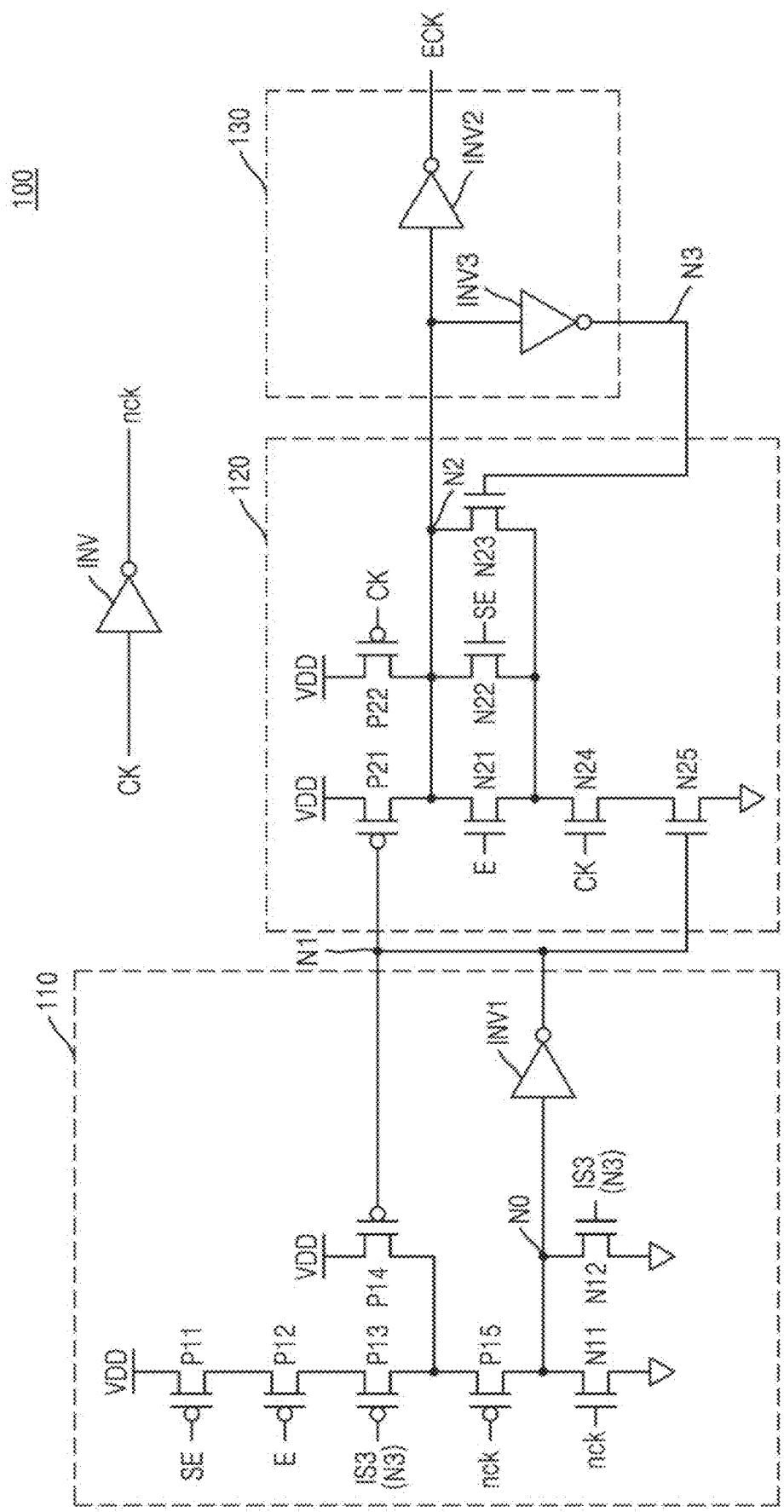
FIG. 3 is a circuit diagram illustrating a clock gating cell according to an example embodiment.

FIG. 3 is a circuit diagram illustrating a clock gating cell according to an example embodiment. In FIG. 3 and subsequent circuit diagrams, a horizontal line (-) connected to one end of the transistor may represent a power supply voltage (e.g., VDD voltage), and an inverted triangle (∇) connected to one end of the transistor may represent a ground voltage (e.g., GND or VSS voltage).

Referring to FIGS. 2 and 3, the first control stage 110 of the clock gating cell 100 may include first to fifth P-type transistors P11 to P15, a first N-type transistor N11, a second N-type transistor N12, and a first inverter circuit INV1.

The power supply voltage VDD may be applied to a source of the first P-type transistor P11, and a drain of the first P-type transistor P11 may be connected to a source of the second P-type transistor P12. The scan enable signal SE may be received through a gate of the first P-type transistor P11.

A drain of the second P-type transistor P12 may be connected to a source of the third P-type transistor P13. An enable signal E may be received through a gate of the second P-type transistor P12.

A drain of the third P-type transistor P13 may be connected to a drain of the fourth P-type transistor P14. A gate of the third P-type transistor P13 may be connected to the third node N3 and the third internal signal IS3 may be received at the third node N3.

A source of the fourth P-type transistor P14 may be applied with the power supply voltage VDD. A gate of the fourth P-type transistor P14 may be connected to the first node N1, and the first internal signal IS1 may be fed back to the first control stage 110 and received at the first node N1.

A source of the fifth P-type transistor P15 may be connected to the drain of the third P-type transistor P13 and the drain of the fourth P-type transistor P14, and a drain of the fifth P-type transistor P15 may be connected to the internal node NO. The inverted clock signal nck may be received through the gate of the fifth P-type transistor P15.

A ground voltage may be applied to a source of the first N-type transistor N11 and a source of the second N-type transistor N12, and a drain of the first N-type transistor N11 and a drain of the second N-type transistor N12 may be connected to the internal node NO. The inverted clock signal nck may be received through a gate of the first N-type transistor N11, and a gate of the second N-type transistor N12 may be connected to the third node N3 and the third internal signal IS3 may be received.

The first inverter circuit INV1 may generate a first internal signal IS1 at the first node N1 by inverting a signal according to the voltage of the internal node NO. That is, an input terminal of the first inverter circuit INV1 may be connected to the internal node NO, and an output terminal of the first inverter circuit INV1 may be connected to the first node N1. In the first control stage 110, the first inverter circuit INV1 may provide a feedback path.

The second control stage 120 of the clock gating cell 100 may include a first P-type transistor P21, a second P-type transistor P22, and first to fifth N-type transistors N21 to N25. The second control stage 120 may be an asymmetric NAND gate circuit, which may indicate that the number of P-type transistors and the number of N-type transistors included in the NAND gate circuit do not match each other.

The power supply voltage VDD may be applied to a source of the first P-type transistor P21, and a drain of the first P-type transistor P21 may be connected to the second node N2. A gate of the first P-type transistor P21 may be connected to the first node N1 and the first internal signal IS1 may be received at the gate of the first P-type transistor P21.

The power voltage VDD may be applied to a source of the second P-type transistor P22, and a drain of the second P-type transistor P22 may be connected to the second node N2. The clock signal CK may be received through the gate of the second P-type transistor P22.

The first to third N-type transistors N21 to N23 may be connected in parallel with each other. A source of each of the first to third N-type transistors N21 to N23 may be connected to a drain of the fourth N-type transistor N24, and a drain of each of the first to third N-type transistors N21 to N23 may be connected to the second node N2. An enable signal E may be received through the gate of the first N-type transistor N21, and a scan enable signal SE may be received through the gate of the second N-type transistor N22, and a gate of the third N-type transistor N23 may be connected to the third node N3 and the third internal signal IS3 may be received at the third node N3.

A source of the fourth N-type transistor N24 may be connected to a drain of the fifth N-type transistor N25. The clock signal CK may be received through the gate of the fourth N-type transistor N24.

A ground voltage may be applied to a source of the fifth N-type transistor N25. A gate of the fifth N-type transistor N25 may be connected to the first node N1 and the first internal signal IS1 may be received at the first node N1.

The output driver 130 of the clock gating cell 100 may include a second inverter circuit INV2 and a third inverter circuit INV3. The second inverter circuit INV2 may invert the second internal signal IS2 and output the inverted second internal signal IS2 as the output clock signal ECK. The third inverter circuit INV3 may invert the second internal signal IS2 and output the inverted second internal signal IS2 as the third internal signal IS3 through the third node N3. The third internal signal IS3 may be provided to each of the first control stage 110 and the second control stage 120.

In the second control stage 120 of the clock gating cell 100 of FIG. 3, the first N-type transistor N21 to which the enable signal E is input and the fourth N-type transistor N24 to which the clock signal CK is input may be closely connected to each other, and that is, the distance between the first N-type transistor N21 and the fourth N-type transistor N24 may be reduced so that they may be closely arranged. Accordingly, the clock gating cell 100 may operate at high speed by improving setup characteristics between the enable signal E and the clock signal CK.

Figure 4A:
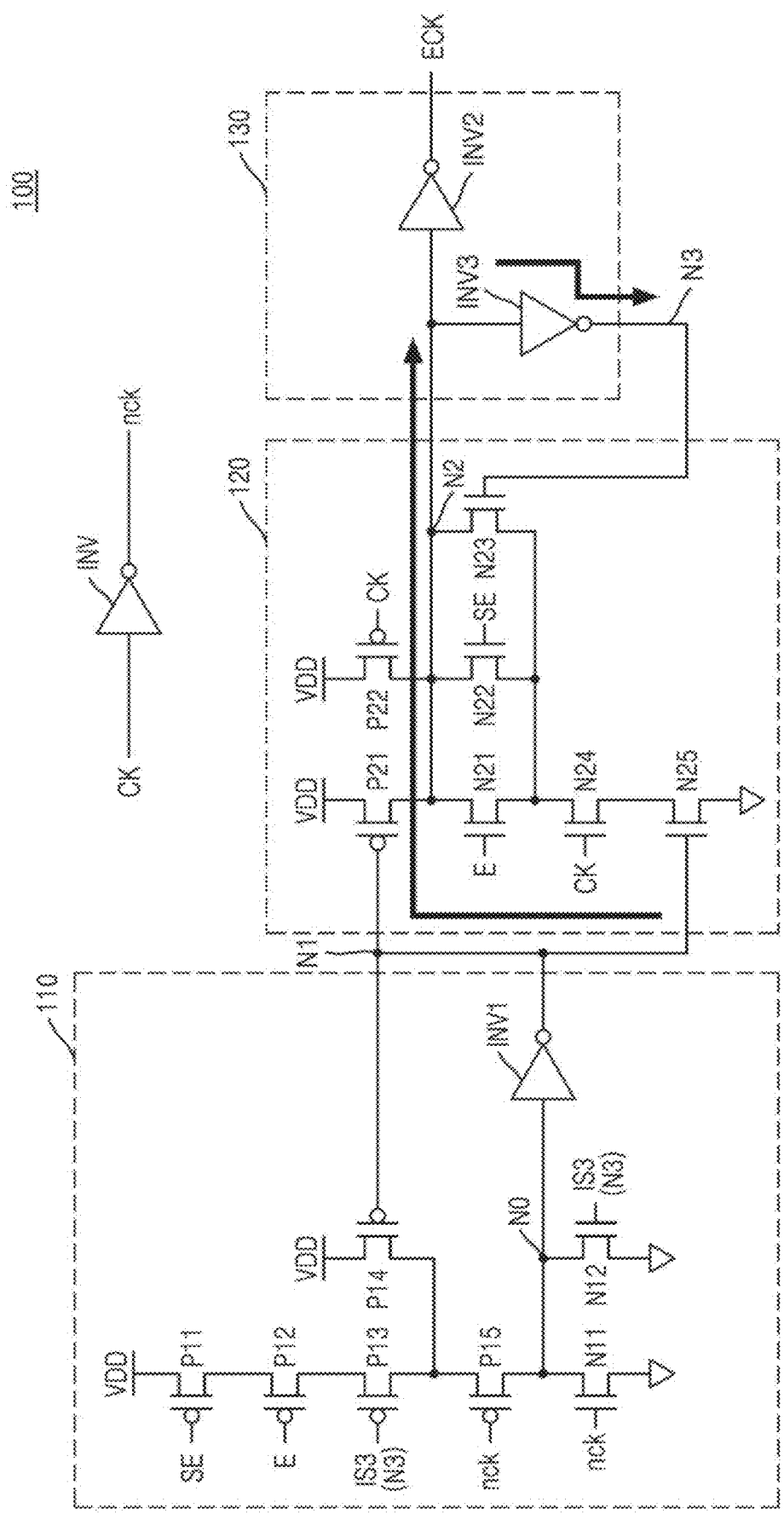
FIGS. 4A and 4B are circuit diagrams illustrating characteristics of a clock gating cell according to an example embodiment.
Figure 4B:
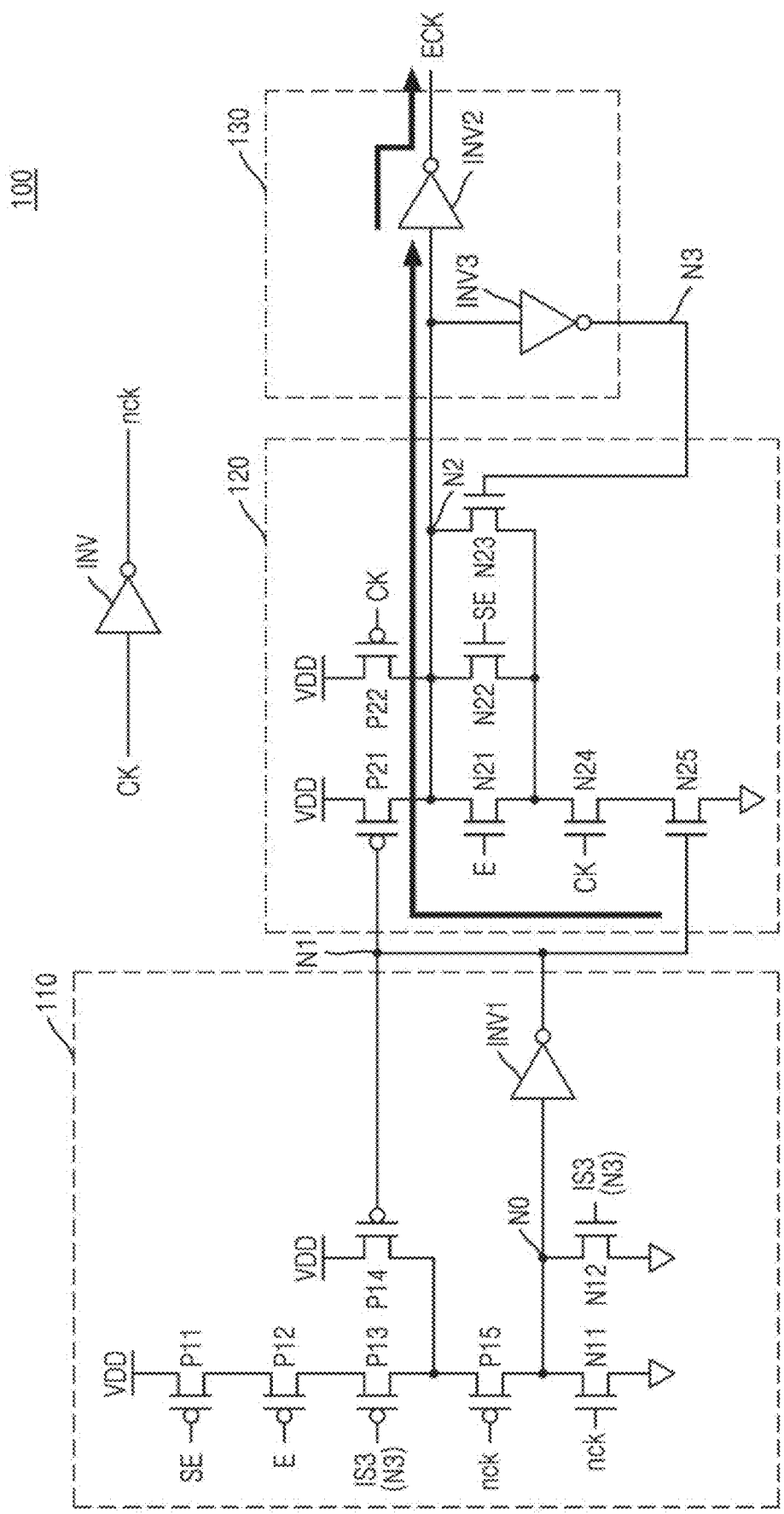
Figure 5:
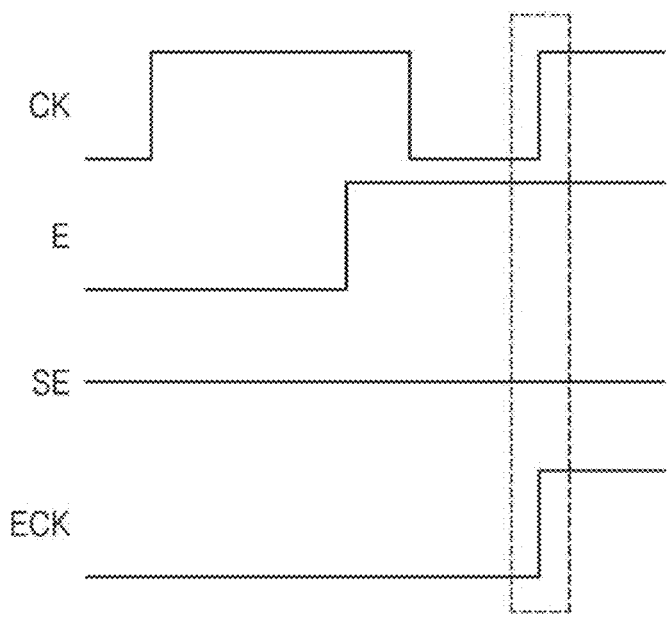
FIG. 5 is a timing diagram for explaining an operation of a clock gating cell according to an example embodiment.

FIGS. 4A and 4B are circuit diagrams illustrating characteristics of a clock gating cell 100 according to an example embodiment. FIG. 5 is a timing diagram for explaining the operation of the clock gating cell 100.

Referring to FIG. 4A, in this example the enable signal E changes from an inactive state to an activated state. When the clock signal is at a logic low level (e.g., 0), the inverted clock signal nck may be at a logic high level (e.g., 1), and the internal node NO and the first node N1 may be precharged to a logic low level 0 and a logic high level 1, respectively.

When the enable signal is activated when the clock signal CK rises from the logic low level 0 to the logic high level 1, because the second node N2 falls from the logic high level 1 to the logic low level 0 and the third node N3 rises from the logic low level 0 to the logic high level 1, the internal node NO and the first node N1 may maintain a logic low level 0 and a logic high level 1, respectively.

In the clock gating cell 100 according to example embodiments, because the first N-type transistor N21 and the fourth N-type transistor N24 of the second control stage 120 are closely connected to each other, the stage of the setup path between the enable signal E and the clock signal CK is simplified, accordingly, a setup characteristic (e.g., a setup rise characteristic) between the enable signal E and the clock signal CK may be improved, and high-speed operation may be possible.

Referring to FIGS. 4A and 5, when the enable signal E and the scan enable signal SE are inactive, that is, both are at a logic low level, even if the clock signal CK is changed to a logic high level, the output clock signal ECK may not be generated. When at least one of the enable signal E and the scan enable signal SE is activated, for example, when the enable signal E transitions from a logic low level to a logic high level, the output clock signal ECK may be generated at the rising edge of the clock signal CK.

At this time, when the enable signal E is activated and the output clock signal ECK is output, the setup characteristics between the enable signal E and the clock signal CK may be related to a time difference between a time point at which the enable signal E is activated and a time point at which a rising edge of the clock signal CK corresponding to the output clock signal ECK is generated. In the clock gating cell of a comparative example in which the rising characteristic is lowered, when the time point at which the rising edge of the clock signal CK occurs is close to the time point at which the enable signal E is activated, the output clock signal ECK may not be generated, and the output clock signal ECK may be generated at the next rising edge of the clock signal CK. Therefore, as the rising characteristic is improved, the time at which the output clock signal ECK is output from the time point at which the enable signal E is activated may be reduced, and the clock gating cell 100 according to example embodiments may be capable of high-speed operation.

Referring to FIG. 4B, the second control stage 120 may perform a NAND operation on the first internal signal IS1 and the clock signal CK. At this time, because the first N-type transistor N21 and the second N-type transistor N22 are connected to each other, when performing a scan test operation or a general operation according to the scan enable signal SE, timings of the enable signal E and the scan enable signal SE may be matched.

In the second control stage 120, a first N-type transistor N21 and a second N-type transistor N22, a fourth N-type transistor N24, and a fifth N-type transistor N25 are sequentially formed from the second node N2 to have a 3-stack structure. To reduce the delay between the time points at which the output clock signal ECK is generated at the rising edge of the clock signal CK, the number of fingers of each of the first N-type transistor N21, the second N-type transistor N22, the fourth N-type transistor N24, and the fifth N-type transistor N25 may be increased to form a plurality of transistors, and the number of fingers of the first N-type transistor N21, the second N-type transistor N22, the fourth N-type transistor N24, and the fifth N-type transistor N25 may be the same. For example, in the clock gating cell 100 of FIG. 6, the number of fingers (i.e., the number of gate lines) of each of the first N-type transistor N21, the second N-type transistor N22, the fourth N-type transistor N24, and the fifth N-type transistor N25, may be two. As an example of the clock gating cell 100, the layout of the clock gating cell 100 will be described later with reference to FIG. 6.

Figure 6:
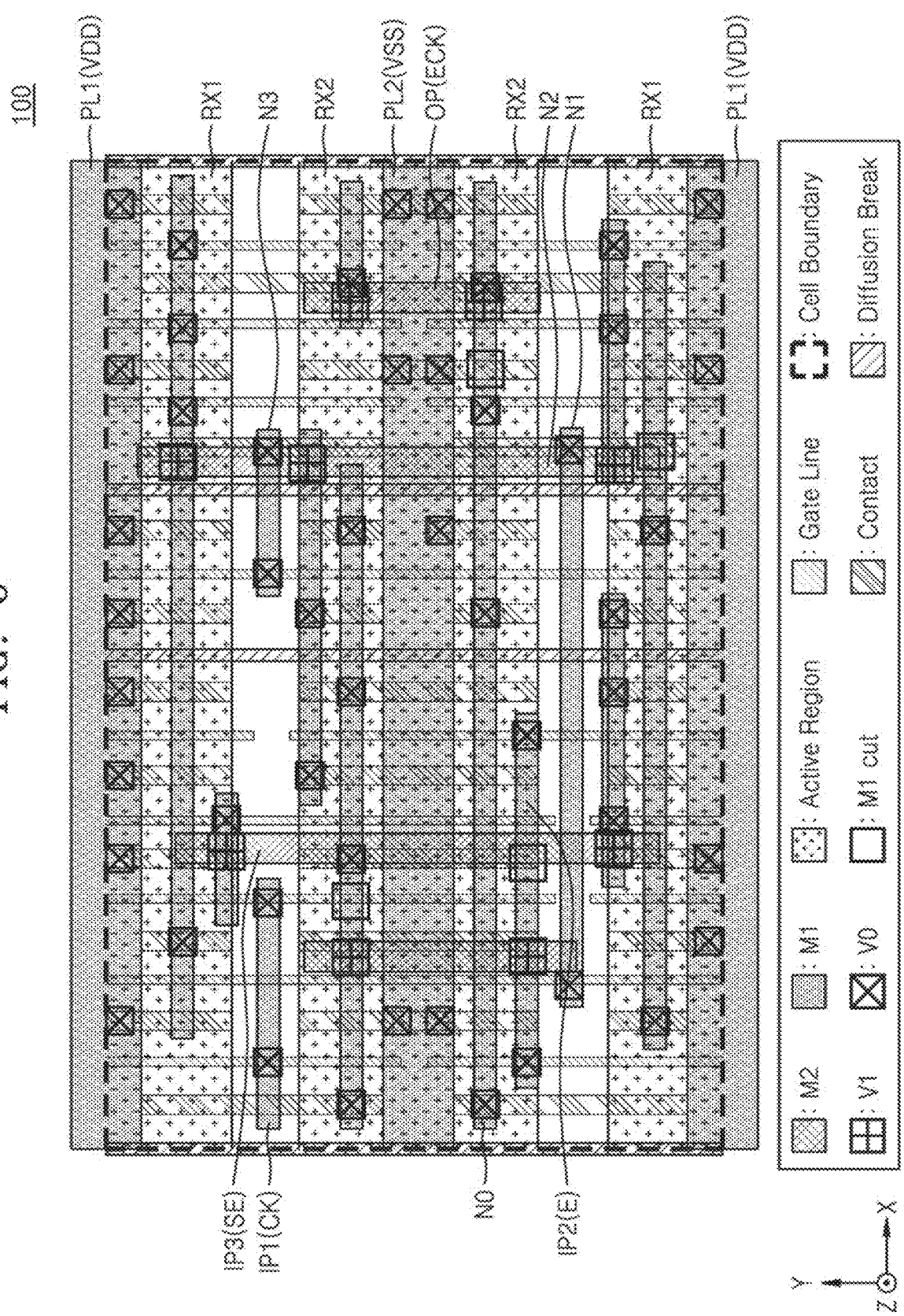
FIG. 6 is a layout diagram illustrating a clock gating cell according to an example embodiment.

FIG. 6 is a layout diagram illustrating a clock gating cell 100 according to an example embodiment.

FIG. 6 is a plan view showing the clock gating cell 100 constituting one chip or one functional block on a plane consisting of an X axis and a Y axis. The clock gating cell 100 of FIG. 6 may implement the clock gating cell 100 of FIG. 3.

In this specification, the Y-axis direction and the X-axis direction may be referred to as a first horizontal direction and a second horizontal direction, respectively, and the Z-axis direction may be referred to as a vertical direction. A plane consisting of the X and Y axes may be referred to as a horizontal plane, and a component disposed in the Z direction relative to other components may be referred to as being above other components, and a component disposed in a reverse direction of the Z-axis direction relative to other components may be referred to as being below the other components.

An integrated circuit may include a plurality of standard cells. A standard cell is a layout unit included in an integrated circuit, may be designed to perform a predefined function, and may be referred to as a cell. An integrated circuit may include a plurality of various standard cells, and the standard cells may be arranged in a row according to a plurality of rows, and a cell height may be defined in the Y-axis direction.

A plurality of standard cells including the clock gating cell 100 of FIG. 6 may be repeatedly used in an integrated circuit design. Standard cells may be pre-designed according to a manufacturing technology and stored in a standard cell library, and integrated circuits may be designed by arranging and interconnecting standard cells stored in the standard cell library according to design rules.

Referring to FIG. 6, the clock gating cell 100 may receive a supply voltage through a first power line PL1 and a second power line PL2. The first power line PL1 and the second power line PL2 may be disposed at a boundary of each of a plurality of rows of the integrated circuit, the first power line PL1 may provide a first supply voltage VDD to each standard cell, and the second power line PL2 may provide a second supply voltage VSS to each standard cell. Each of the first supply voltage VDD and the second supply voltage VSS may be a power supply voltage or a ground voltage.

The first power line PL1 and the second power line PL2 may be formed as conductive patterns extending in the X-axis direction and may be alternately disposed in the Y-axis direction. Although FIG. 6 shows that each of the first power line PL1 and the second power line PL2 is formed as a pattern of the first metal layer M1, the integrated circuit according to example embodiments is not limited thereto, and each of the first power line PL1 and the second power line PL2 may be formed as a pattern of an upper metal layer of the first metal layer M1 or may be formed inside a separation trench formed in the substrate.

The clock gating cell 100 may be defined by a cell boundary. A cell height of the clock gating cell 100 may be defined in the Y-axis direction based on the cell boundary.

A first power line PL1 and a diffusion break may be formed at a cell boundary of the clock gating cell 100. The diffusion break may electrically separate the active regions of the clock gating cell 100 and other standard cells from each other. Also, the clock gating cell 100 may include a diffusion break therein, and the first active region RX1 and the second active region RX2 may be divided by the diffusion break. Although a single diffusion break is shown in FIG. 6, a double diffusion break may be formed at the cell boundary. The diffusion break may include a silicon-containing insulating layer, such as a silicon oxide layer, a silicon nitride layer, a silicon oxynitride layer, a silicon carbonitride layer, or a combination thereof. For example, diffusion break may include fluoride silicate glass (FSG), undoped silicate glass (USG), boro-phospho-silicate glass (BPSG), phospho-silicate glass (PSG), flowable oxide (FOX), and plasma (PE-TEOS). enhanced tetra-ethyl-ortho-silicate), or tonen silazene (TOSZ).

The clock gating cell 100 may include a plurality of gate lines extending in the Y-axis direction and spaced apart from each other in the X-axis direction, and may include a first active region RX1 and a second active region RX2 extending in the X-axis direction. An active pattern formed in each of the first active region RX1 and the second active region RX2 may cross a gate line extending in the Y-axis direction to form a transistor. A P-type transistor may be formed in the first active region RX1, and an N-type transistor may be formed in the second active region RX2.

At least one fin extending in the X-axis direction may be formed, or a nanowire or nanosheet may be formed on the first active region RX1 and the second active region RX2. Therefore, the gate line and the active region may form a Fin Field Effect Transistor (FinFET), a Gate All Around Field Effect Transistor (GAAFET) may be formed, and a Multi Bridge Channel (MBC) FET may be formed. However, it will be understood that the description of the present specification may also be applied to clock gating cells including transistors having a structure different from the FinFET.

In an example embodiment, the first active region RX1 and the second active region RX2 may include a semiconductor such as silicon (Si) or germanium (Ge), or a compound semiconductor, such as SiGe, SiC, GaAs, InAs or InP, and may include a conductive region, for example, a well doped with impurities and a structure doped with impurities. In an example embodiment, the gate line may include a work function metal-containing layer and a gap-fill metal layer. For example, the work function metal-containing layer may include at least one of Ti, W, Ru, Nb, Mo, Hf, Ni, Co, Pt, Yb, Tb, Dy, Er, and Pd, and the gap-fill metal layer may be formed of a W layer or an Al layer. In an example embodiment, the gate lines may include a TiAlC/TiN/W stack structure, a TiN/TaN/TiAlC/TiN/W stack structure, or a TiN/TaN/TiN/TiAlC/TiN/W stack structure.

A plurality of metal layers sequentially stacked in a vertical direction may be formed in the clock gating cell 100. For example, the second metal layer M2 may be formed on the first metal layer M1, which is disposed closest to the substrate. In an example embodiment, the first metal layer M1 may include patterns extending in the X-axis direction, and the second metal layer M2 may include patterns extending in the Y-axis direction. However, example embodiments are not limited thereto, and another metal layer may be further formed on the second metal layer M2, and the direction of the pattern of the first metal layer M1 and the direction of the pattern of the second metal layer M2 may be changed.

The patterns formed on each of the metal layers M1 and M2 may be made of metal, conductive metal nitride, metal silicide, or a combination thereof. In the drawings of this specification, only some layers may be shown for convenience of illustration, and to indicate the connection between the pattern of the metal layers M1 and M2 and the sub-pattern, the vias V0 and V1 may be displayed even though they are located under the patterns of the metal layers M1 and M2.

The clock gating cell 100 may include a plurality of first vias V0 providing electrical connections between the pattern of the first metal layer M1 and the lower pattern, and may include a plurality of second vias V1 providing electrical connections between the pattern of the first metal layer M1 and the pattern of the second metal layer M2. For example, the plurality of first vias V0 may connect the first metal layer M1 to the gate line, or for example, the plurality of first vias V0 may connect the first metal layer M1 to contacts on the first active region RX1 or the second active region RX2. However, example embodiments are not limited thereto, and the plurality of first vias V0 may be formed so that the first metal layer M1 and the first active region RX1 or the second active region RX2 are in direct contact with each other, and may be formed such that the first metal layer M1 and the gate contact on the gate line come into contact with each other.

The patterns of the first metal layer M1 may be separated from each other by the M1 cut. When the pattern of the first metal layer M1 is separated by the M1 cut, the tip of the pattern may be concave. Although only the M1 cut is shown in FIG. 6, the clock gating cell 100 may further include gate line cuts for separating gate lines and contact cuts for separating contacts.

The clock gating cell 100 may include a first input pin IP1, a second input pin IP2, and a third input pin IP3. The clock gating cell 100 may receive a clock signal CK through a first input pin IP1, receive an enable signal E through a second input pin IP2, and receive the scan enable signal SE through the third input pin IP3. In an example embodiment, the first input pin IP1 and the second input pin IP2 may be formed as a pattern of the first metal layer M1, and the third input pin IP3 may be formed as a pattern of the second metal layer M2.

The clock gating cell 100 may include an output pin OP that outputs an output clock signal ECK. In an example embodiment, the output pin OP may be formed as a pattern of the second metal layer M2.

In an example embodiment, the first node N1 and the third node N3 of the clock gating cell 100 may be formed as a pattern of the first metal layer M1, and the second node N2 may be formed as a pattern of the second metal layer M2, and the internal node NO may be formed as a pattern of the first metal layer M1.

The clock gating cell 100 may be a multiple height cell consecutively arranged in rows adjacent to each other. For example, the clock gating cells 100 may be disposed in a first row and a second row. In an example embodiment, an inverter circuit INV (see FIG. 3) and a third inverter circuit INV3 (see FIG. 3) may be disposed in the first row of the clock gating cell 100, and a first control stage 110 (see FIG. 3) and a first inverter circuit INV1 (see FIG. 3) may be disposed in the second row of the clock gating cell 100. Also, in an example embodiment, the second control stage 120 (see FIG. 3) and the second inverter circuit INV2 may be disposed across the first row and the second row of the clock gating cell 100. In an example embodiment, first to third inverter circuits INV1 to INV3 may be disposed on the right side of the rightmost diffusion break among the diffusion breaks disposed inside the clock gating cell 100 and not disposed at the cell boundary.

In an example embodiment, the number of fingers (i.e., the number of gate lines) of each of the first N-type transistor N21, the second N-type transistor N22, the fourth N-type transistor N24, and the fifth N-type transistor N25 of the clock gating cell 100, may be two. In an example embodiment, the second inverter circuit INV2 may be a 4-driver inverter circuit, and that is, each of the P-type transistor and the N-type transistor constituting the second inverter circuit INV2 includes four gate lines.

Figure 7:
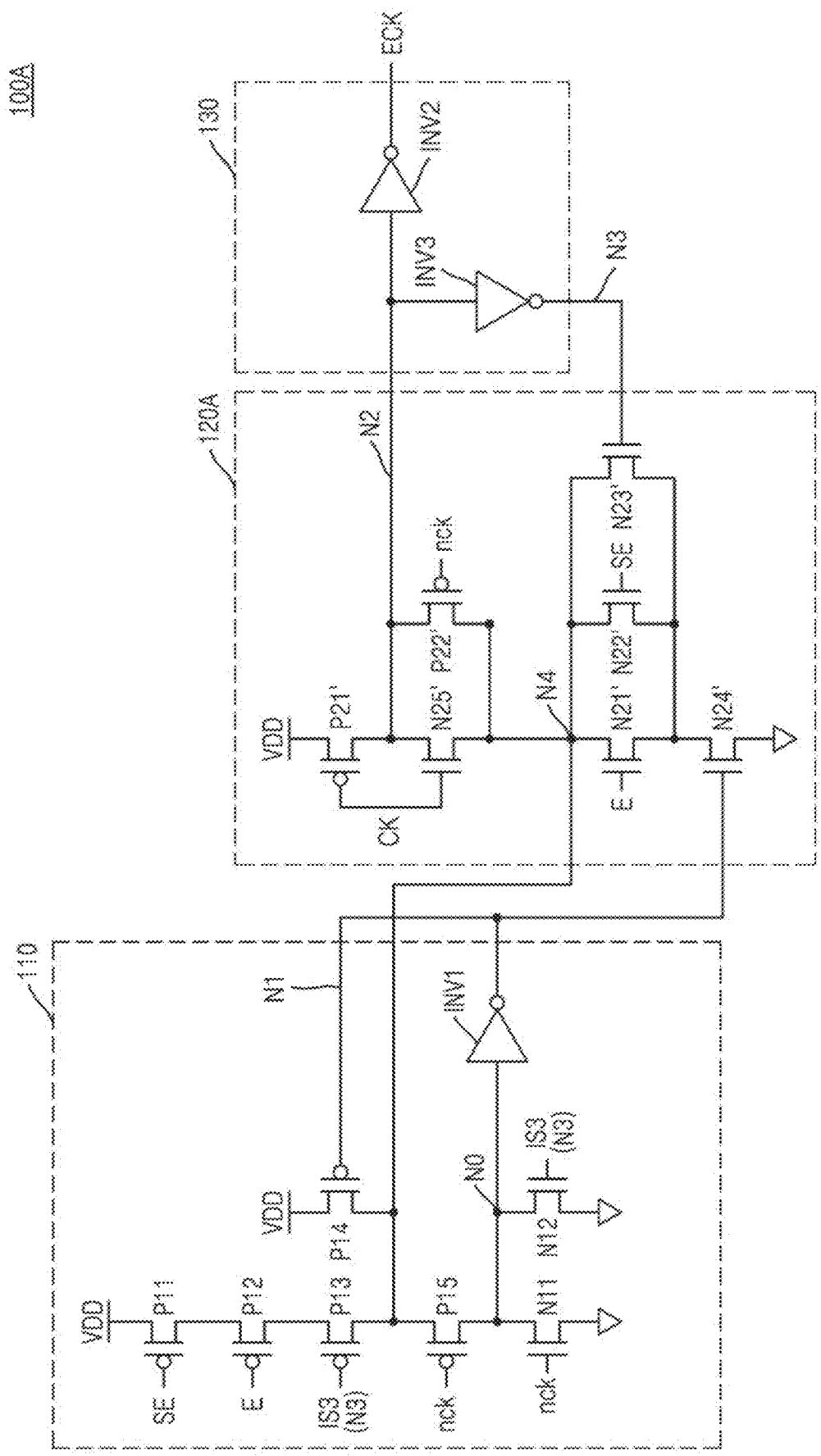
FIG. 7 is a circuit diagram illustrating a clock gating cell according to an example embodiment.

FIG. 7 is a circuit diagram illustrating a clock gating cell according to an example embodiment. In the description of FIG. 7, redundant descriptions of the same symbols as in FIG. 3 will be omitted. The second control stage 120A of FIG. 7 may be the second control stage 120 of FIG. 2.

Referring to FIGS. 2 and 7, the second control stage 120A of the clock gating cell 100 may include a first P-type transistor P21', a second P-type transistor P22', and first through fifth N-type transistors N21' to N25'.

A source of the first P-type transistor P21' may be applied with the power supply voltage VDD, and a drain of the first P-type transistor P21' may be connected to the second node N2. A gate of the first P-type transistor P21' may receive the clock signal CK.

A source of the second P-type transistor P22' may be connected to the second node N2, and a drain of the second P-type transistor P22' may be connected to the fourth node N4. The inverted clock signal nck may be received through the gate of the second P-type transistor P22'. The fourth node N4 may be connected to the drain of the third P-type transistor P13, the drain of the fourth P-type transistor P14, and the source of the fifth P-type transistor P15 of the first control stage 110.

A source of the fifth N-type transistor N25' may be connected to the fourth node N4, and a drain of the fifth N-type transistor N25' may be connected to the second node N2. The clock signal CK may be received through the gate of the fifth N-type transistor N25'. The second P-type transistor P22' and the fifth N-type transistor N25' may operate as a transmission gate circuit that is switched according to the clock signal CK and the inverted clock signal nck.

The first to third N-type transistors N21' to N23' may be connected in parallel with each other. A source of each of the first to third N-type transistors N21' to N23' may be connected to a drain of the fourth N-type transistor N24', and a drain of each of the first to third N-type transistors N21' to N23' may be connected to the fourth node N4. An enable signal E may be received through the gate of the first N-type transistor N21', and a scan enable signal SE may be received through the gate of the second N-type transistor N22', and a gate of the third N-type transistor N23' may be connected to the third node N3 and the third internal signal IS3 may be received at the third node N3.

A ground voltage may be applied to a source of the fourth N-type transistor N24'. A gate of the fourth N-type transistor N24' may be connected to the first node N1 and the first internal signal IS1 may be received at the first node N1.

In the second control stage 120A of the clock gating cell 100A of FIG. 7, the distance (signal transfer distance) from the second P-type transistor P22' and the fifth N-type transistor N25' constituting the transmission gate circuit to the second node N2 may be shorter than the distance (signal transfer distance) from the first N-type transistor N21' to which the enable signal E is input to the second node N2. Therefore, the clock gating cell 100A may reduce the delay time between the clock signal CK and the output clock signal ECK, and may operate at high speed.

Figure 8:
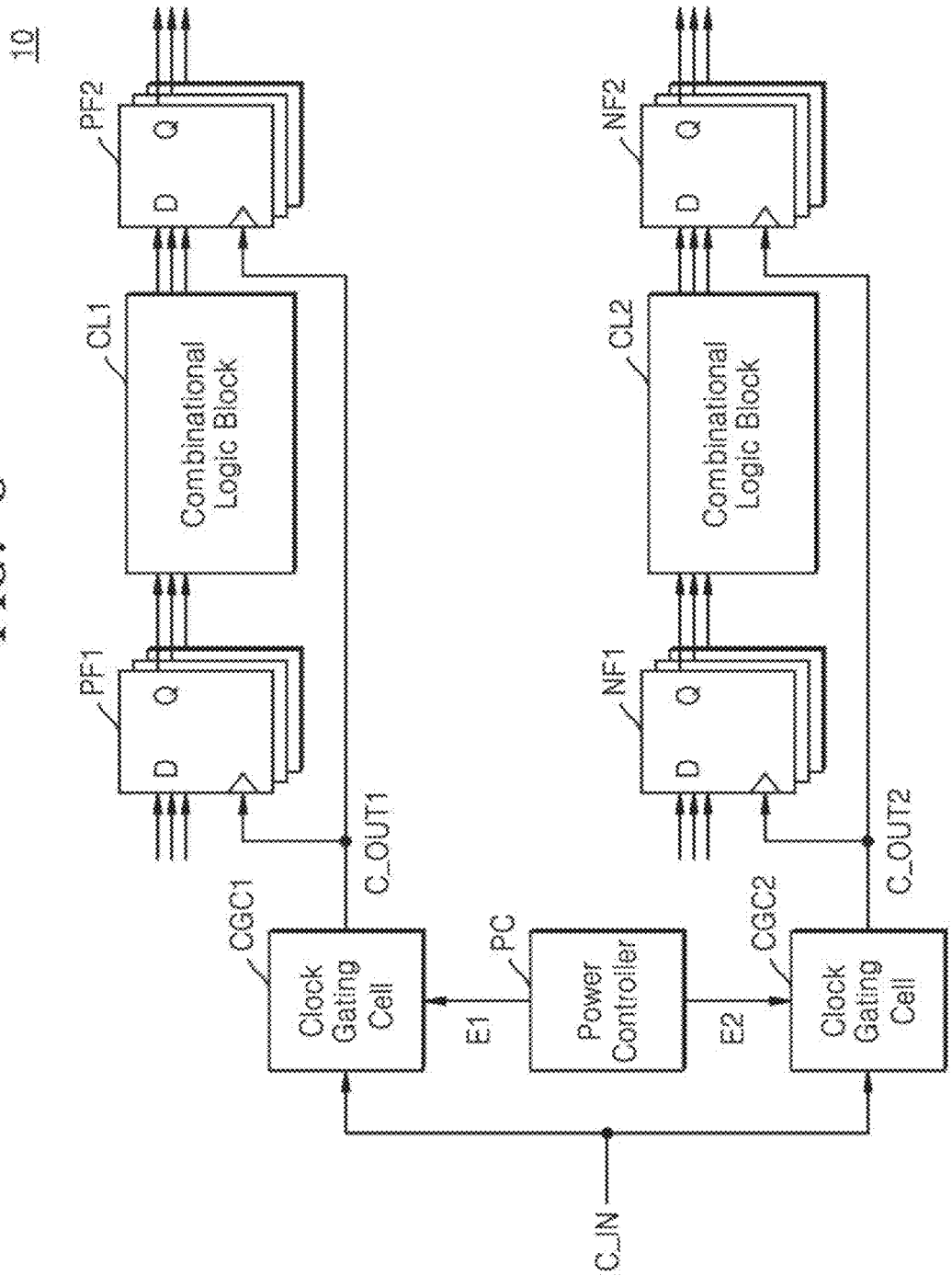
FIG. 8 is a block diagram illustrating an integrated circuit including a clock gating cell according to an example embodiment.

FIG. 8 is a block diagram illustrating an integrated circuit 10 including clock gating cells 100 and 100A according to an example embodiment. In some example embodiments, the clock gating cell described above with reference to the figures may be included in an integrated circuit that processes a digital signal. As shown in FIG. 8, the integrated circuit 10 may include first and second clock gating cells CGC1 and CGC2, a power controller PC, first and second combinational logic blocks CL1 and CL2, and a plurality of flip-flops PF1, PF2, NF1, and NF2.

The power controller PC may control power of the integrated circuit 10 and generate first and second enable signals E1 and E2. For example, the power controller PC may generate a deactivated first enable signal E1 to reduce power consumption by a digital circuit including at least one first positive edge triggered flip-flop PF1, a first combinational logic block CL1, and at least one second positive edge triggered flip-flop PF2. In addition, the power controller PC may generate a deactivated second enable signal E2 to reduce power consumption by a digital circuit including at least one third positive edge triggered flip-flop NF1, a second combinational logic block CL2, and at least one fourth positive edge triggered flip-flop NF2.

The first clock gating cell CGC1 may receive the clock signal C_IN, and may stop or resume supply of the first output clock signal C_OUT1 based on the first enable signal E1. For example, the first clock gating cell CGC1 may generate the first output clock signal C_OUT1 maintained at logic '0' in an inactive state. Accordingly, the first output clock signal C_OUT1 may be supplied to a positive edge triggered flip-flop, for example, at least one first positive edge triggered flip-flop PF1 and at least one second positive edge triggered flip-flop PF2.

Also, the second clock gating cell CGC2 may receive the clock signal C_IN, and may stop or resume supply of the second output clock signal C_OUT2 based on the second enable signal E2. For example, the second clock gating cell CGC2 may generate the second output clock signal C_OUT2 maintained at logic '0' in an inactive state. Accordingly, the second output clock signal C_OUT2 may be supplied to the positive edge triggered flip-flop, for example, at least one third positive edge triggered flip-flop NF1 and at least one fourth positive edge triggered flip-flop NF2.

In an example embodiment, at least one third positive edge triggered flip-flop NF1 and at least one fourth positive edge triggered flip-flop NF2 may be negative edge triggered flip-flops other than positive edge triggered flip-flops. For example, the second clock gating cell CGC2 may generate the second output clock signal C_OUT2 maintained at logic '1' in an inactive state. Accordingly, the second output clock signal C_OUT2 may be supplied to the negative edge triggered flip-flop.

Each of the first clock gating cell CGC1 and the second clock gating cell CGC2 of FIG. 8 may be the clock gating cells 100 and 100A described with reference to FIGS. 3 and 7. The first output clock signal C_OUT1 and the second output clock signal C_OUT2 output from the first clock gating cell CGC1 and the second clock gating cell CGC2 activated by the first enable signal E1 and the second enable signal E2, respectively, may have different characteristics.

The clock signal C_IN, which is a global clock signal, may be transmitted to each of the first clock gating cell CGC1 and the second clock gating cell CGC2 through the buffer tree, and from each of the first clock gating cell CGC1 and the second clock gating cell CGC2 to the positive edge triggered flip-flops PF1, PF2, NF1, and NF2, the first output clock signal C_OUT1 or the second output clock signal C_OUT2 may be transferred through the buffer tree.

Figure 9:
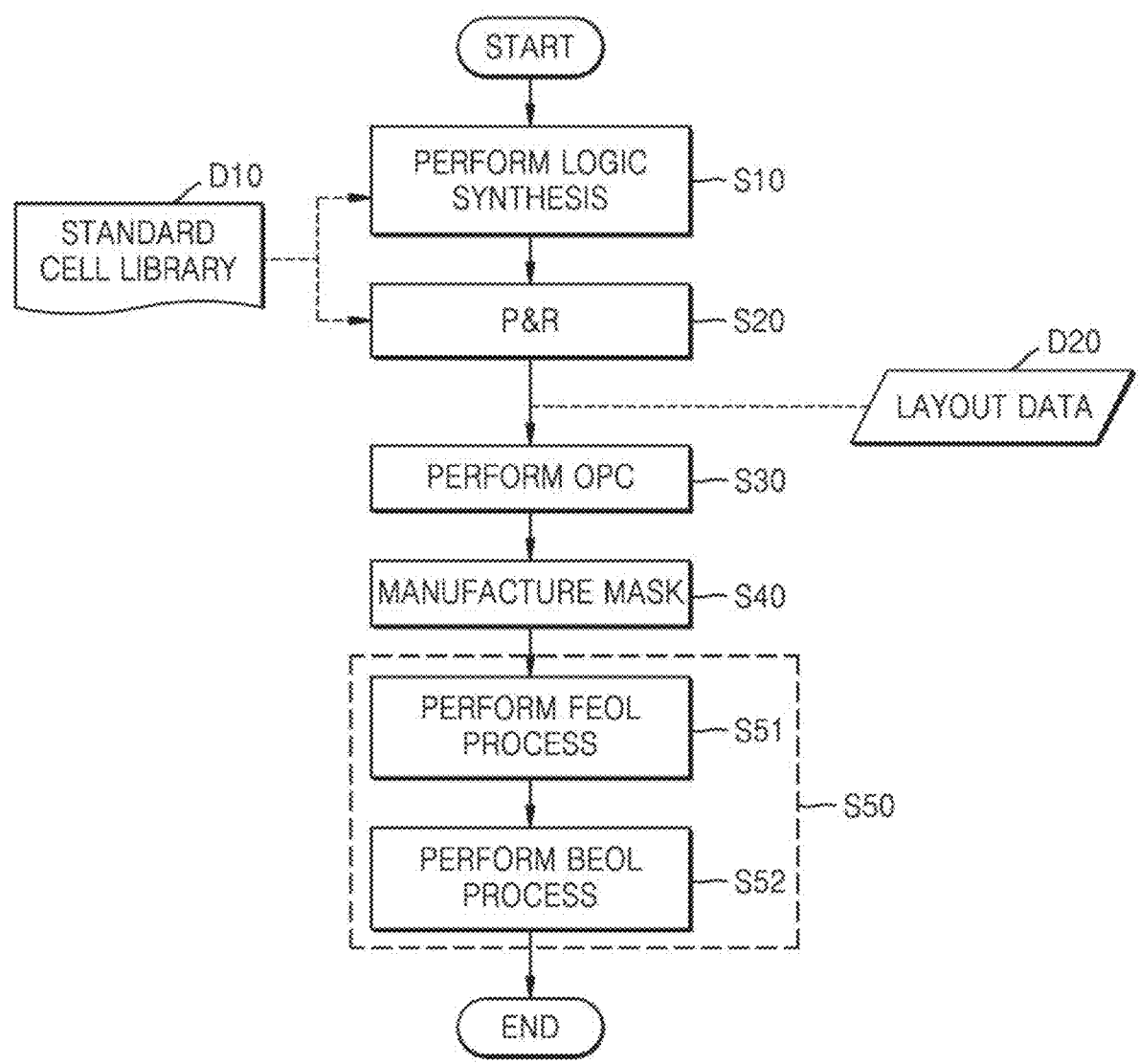
FIG. 9 is a flowchart illustrating a method for fabricating an integrated circuit, according to an example embodiment.
Figure 10:
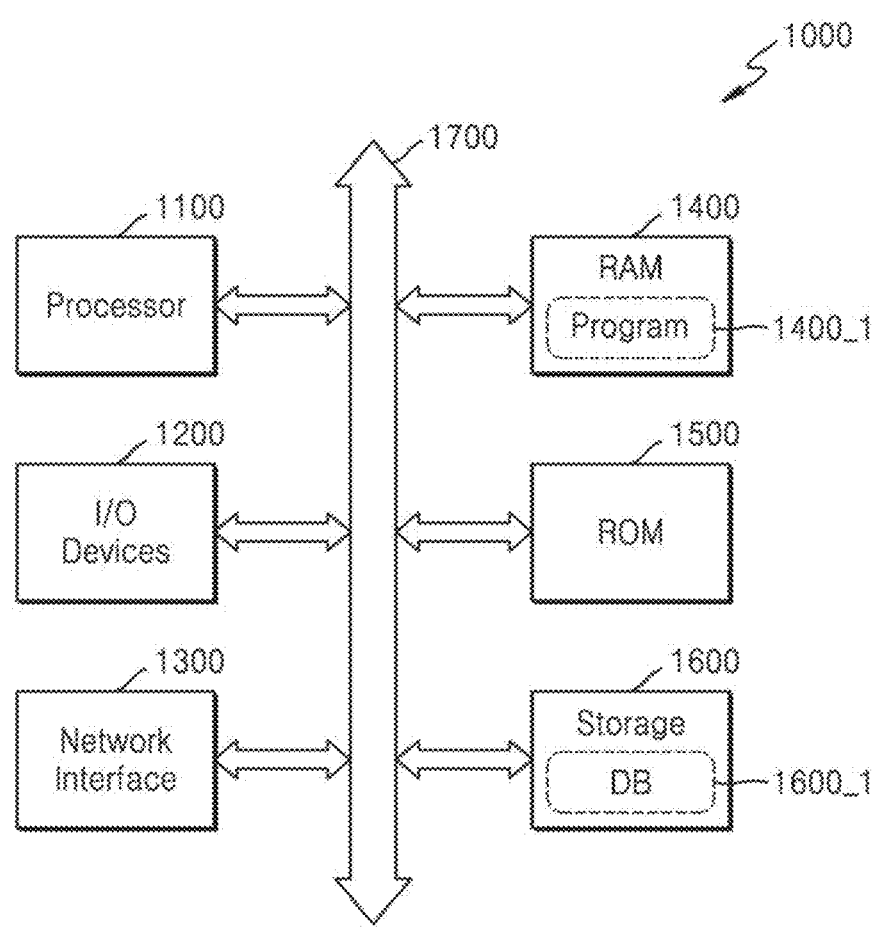
FIG. 10 is a block diagram illustrating a computing system including a memory for storing a program, according to an example embodiment.

FIG. 9 is a flowchart illustrating a method for fabricating an integrated circuit 10 according to an example embodiment. Specifically, the flowchart of FIG. 10 represents a method for fabricating an integrated circuit (IC) (e.g., 10 of FIG. 8) that includes the clock gating cell described above.

The standard cell library (or cell library) D10 may include information about standard cells, such as function information, characteristic information, and layout information, and may include information about clock gating cells. As described above with reference to the drawings, the clock gating cells defined by the standard cell library D10 may be capable of high-speed operation, and may be the clock gating cells 100 and 100A described with reference to FIGS. 2, 3, and 7.

In operation S10, a logic synthesis operation may be performed to generate a netlist from RTL data. For example, a semiconductor design tool (e.g., a logic synthesis tool) may generate a bitstream or a netlist by performing logic synthesis with reference to the standard cell library D10 from RTL data written as VHSIC Hardware Description Language (VHDL) and Hardware Description Languages (HDL) such as Verilog. The standard cell library D10 may include information about performance of the clock gating cells 100 and 100A, and the standard cells may be included in an IC by referring to such information in a logic synthesis process.

In operation S20, a Place & Routing (P&R) operation of generating layout data D20 from the netlist may be performed. In operation S20 for P&R, an operation of arranging standard cells, an operation of generating interconnections, and an operation of generating layout data D20 may be performed.

For example, a semiconductor design tool (e.g., a P&R tool) may arrange a plurality of standard cells by referring to the standard cell library D10 from a netlist. For example, the semiconductor design tool may arrange the layout of the clock gating cells 100 and 100A defined by the netlist by referring to the standard cell library D10.

In the operation of creating the interconnections, the interconnection electrically connects an output pin to an input pin of a standard cell, and may include, for example, at least one via and at least one conductive pattern. Layout data D20 may have a format, such as GDSII, and may include geometric information of standard cells and interconnections.

In operation S30, Optical Proximity Correction (OPC) may be performed. The OPC may refer to an operation to form a pattern of a desired shape by correcting distortion phenomena such as refraction caused by the characteristics of light in photolithography, which is involved in semiconductor processes for manufacturing ICs, and by applying the OPC to the layout data 20, the pattern on the mask may be determined. In an example embodiment, the layout of an IC may be modified in a limited manner in operation S30, and the limited modification of the IC in operation S30 is post-processing for optimizing the structure of the IC, and may be referred to as design polishing.

In operation S40, an operation of manufacturing a mask may be performed. For example, as the OPC is applied to the layout data D20, patterns on the mask may be defined to form patterns formed on a plurality of layers, and at least one mask (or photomask) for forming patterns of each of a plurality of layers may be manufactured.

In operation S50, an operation of fabricating the IC may be performed. For example, an IC may be fabricated by patterning a plurality of layers using at least one mask fabricated in operation S40. As shown in FIG. 9, operation S50 may include operations S51 and S52. In operation S51, a front-end-of-line (FEOL) process may be performed. The FEOL may refer to a process of forming individual elements, for example, transistors, capacitors, resistors, and the like, on a substrate during the manufacturing process of an IC. For example, the FEOL process may include planarizing and cleaning a wafer, forming a trench, forming a well, forming a gate line, and forming a source and a drain. In operation S52, a back-end-of-line (BEOL) process may be performed. The BEOL may refer to a process of interconnecting individual elements, e.g., transistors, capacitors, resistors, and the like, in the process of manufacturing an IC. For example, the BEOL process may include performing silicidation on a gate, a source and a drain, adding a dielectric, performing planarization, forming a hole, adding a metal layer, forming a via, and forming a passivation layer. Then, the IC may be packaged in a semiconductor package and used as a component in various applications. As described above, due to the favorable characteristics of the clock gating cell, an IC may have high performance and efficiency, and as a result, the performance and efficiency of applications including the IC may be improved.

FIG. 10 is a block diagram showing a computing system 1000 including a memory storing a program according to an example embodiment. At least some of the operations included in a method for manufacturing an IC (e.g., the method of FIG. 9) according to an example embodiment may be performed by the computing system 1000. The computing system 1000 may be a fixed computing system, such as a desktop computer, a workstation, a server, and the like and may be a portable computing system, such as a laptop computer.

Referring to FIG. 10, the computing system 1000 may include a processor 1100, input/output (I/O) devices 1200, a network interface 1300, a random access memory (RAM) 1400, a read only memory (ROM) 1500, and a storage device 1600. The processor 1100, the I/O devices 1200, the network interface 1300, the RAM 1400, the ROM 1500, and the storage device 1600 may be connected to the bus 1700, and may communicate with each other through the bus 1700.

The processor 1100 may be referred to as a processing unit, and for example, may include at least one core capable of executing an arbitrary instruction set (e.g., Intel Architecture-32 (IA-32), 64-bit extension IA-32, x86-64, PowerPC, Sparc, MIPS, ARM, IA-64, and the like), such as a micro-processor, an application processor (AP), a digital signal processor (DSP), and a graphics processing unit (GPU). For example, the processor 1100 may access memory, that is, the RAM 1400 or the ROM 1500 through the bus 1700, and may execute instructions stored in the RAM 1400 or the ROM 1500.

The RAM 1400 may store a program 1420 for manufacturing an IC according to an example embodiment or at least a part thereof, and the program 1420 may cause the processor 1100 to perform at least some of the operations included in a method for manufacturing an IC (e.g., the method of FIG. 9). That is, the program 1420 may include a plurality of instructions executable by the processor 1100, and a plurality of instructions included in the program 1420 may cause the processor 1100 to perform at least some of the operations included in the flowchart described above with reference to FIG. 9.

The storage device 1600 may not lose stored data even when the power supplied to the computing system 1000 is cut off. For example, the storage device 1600 may include a nonvolatile memory device or a storage medium, such as a magnetic tape, an optical disk, or a magnetic disk. Also, the storage device 1600 may be removable from the computing system 1000. The storage device 1600 may store the program 1420 according to an example embodiment, and before the program 1420 is executed by the processor 1100, the program 1420 or at least a portion thereof may be loaded into the RAM 1400 from the storage device 1600. Alternatively, the storage device 1600 may store a file written in a program language, and the program 1420 generated by a compiler or the like from a file or at least a part thereof may be loaded into the RAM 1400. Also, as shown in FIG. 10, the storage device 1600 may store the database 1600_1, and the database 1600_1 may include information necessary for designing an integrated circuit, for example, the standard cell library D10 of FIG. 9.

The storage device 1600 may store data to be processed by the processor 1100 or data processed by the processor 1100. That is, the processor 1100 may generate data by processing data stored in the storage device 1600 according to the program 1420 and may store the generated data in the storage device 1600. For example, the storage device 1600 may store RTL data, netlist, and/or layout data D20 described with reference to FIG. 9.

The input/output devices 1200 may include an input device, such as a keyboard and a pointing device, and may include an output device, such as a display device and a printer. For example, a user may trigger execution of the program 1420 by the processor 1100 through the input/output devices 1200, and input the RTL data and/or netlist described with reference to FIG. 9 and may check the layout data D20 of FIG. 9.

The network interface 1300 may provide access to a network external to the computing system 1000. For example, a network may include multiple computing systems and communication links, and the communication links may include wired links, optical links, wireless links, or any other type of links.

While aspects of example embodiments have been particularly shown and described, it will be understood that various changes in form and details may be made therein without departing from the spirit and scope of the following claims.

What is claimed is:

1. A clock gating cell comprising:
   an inverter circuit configured to generate an inverted clock signal by inverting a clock signal;
   a first control circuit configured to receive the inverted clock signal, an enable signal, and a scan enable signal, and output a first internal signal at a first node;
   a second control circuit configured to receive the first internal signal, the clock signal, the enable signal, and the scan enable signal, and output a second internal signal at a second node; and
   an output driver configured to receive the second internal signal, and output an output clock signal to an output node and a third internal signal to a third node,
   wherein the first control circuit and the second control circuit are configured to receive the third internal signal at the third node.

2. The clock gating cell of claim 1, wherein the first control circuit comprises:
   a first P-type transistor comprising a gate to which the scan enable signal is input;
   a second P-type transistor comprising a gate to which the enable signal is input and a source connected to a drain of the first P-type transistor;
   a third P-type transistor comprising a gate connected to the third node and a source connected to a drain of the second P-type transistor;
   a fourth P-type transistor comprising a source to which a power supply voltage is applied and a drain connected to a drain of the third P-type transistor;
   a fifth P-type transistor comprising a gate to which the inverted clock signal is input, a source connected to the drain of the third P-type transistor, and a drain connected to an internal node;
   a first N-type transistor comprising a gate to which the inverted clock signal is input and a drain connected to the internal node;
   a second N-type transistor comprising a gate connected to the third node and a drain connected to the internal node; and
   a first inverter circuit comprising an input terminal connected to the internal node.

3. The clock gating cell of claim 2, wherein a gate of the fourth P-type transistor and an output terminal of the first inverter circuit are connected to the first node to provide a feedback path for the first control circuit.

4. The clock gating cell of claim 1, wherein the second control circuit comprises:
   a first P-type transistor comprising a gate connected to the first node and a drain connected to the second node;
   a second P-type transistor comprising a gate to which the clock signal is input and a drain connected to the second node;
   a first N-type transistor, a second N-type transistor and a third N-type transistor that are connected to each other in parallel, each of the first N-type transistor, the second N-type transistor and the third N-type transistor comprising a drain connected to the second node;
   a fourth N-type transistor comprising a gate to which the clock signal is input and a drain connected to a source of the first N-type transistor; and
   a fifth N-type transistor comprising a gate connected to the first node and a drain connected to a source of the fourth N-type transistor.

5. The clock gating cell of claim 4, wherein the first N-type transistor of the second control circuit comprises a gate to which the enable signal is input,
   wherein the second N-type transistor of the second control circuit comprises a gate to which the scan enable signal is input,
   wherein the third N-type transistor of the second control circuit comprises a gate connected to the third node.

6. The clock gating cell of claim 1, wherein the output driver comprises:
   a second inverter circuit having an input terminal connected to the second node, and configured to output the output clock signal at the output node; and
   a third inverter circuit having an input terminal connected to the second node and an output terminal connected to the third node.

7. The clock gating cell of claim 1, wherein the second control circuit comprises:
   a first P-type transistor comprising a gate to which the clock signal is input and a drain connected to the second node;
   a transmission gate circuit connected between the second node and a fourth node, and configured to be switched according to the clock signal and the inverted clock signal;
   a first N-type transistor, a second N-type transistor and a third N-type transistor that are connected to each other in parallel, each of the first N-type transistor, the second N-type transistor and the third N-type transistor comprising a drain connected to the fourth node; and
   a fourth N-type transistor comprising a gate connected to the first node and a drain connected to a source of the first N-type transistor.

8. The clock gating cell of claim 7, wherein the transmission gate circuit comprises:
   a second P-type transistor comprising a gate to which the inverted clock signal is input, a source connected to the second node, and a drain connected to the fourth node; and
   a fifth N-type transistor comprising a gate to which the clock signal is input, a drain connected to the second node, and a source connected to the fourth node.

9. The clock gating cell of claim 7, wherein the first N-type transistor comprises a gate to which the enable signal is input,
   wherein the second N-type transistor comprises a gate to which the scan enable signal is input, and
   wherein the third N-type transistor comprises a gate connected to the third node.

10. The clock gating cell of claim 7, wherein the fourth node electrically connected to the first control circuit and the second control circuit.

11. An asymmetric NAND gate circuit comprising:
    a first P-type transistor comprising a gate connected to a first node and a drain connected to a second node;
    a second P-type transistor comprising a gate to which a clock signal is input and a drain connected to the second node;
    a first N-type transistor, a second N-type transistor and a third N-type transistor that are connected to each other in parallel, each of the first N-type transistor, the second N-type transistor and the third N-type transistor comprising a drain connected to the second node;

a fourth N-type transistor comprising a gate to which the clock signal is input and a drain connected to a source of the first N-type transistor; and a fifth N-type transistor comprising a gate connected to the first node and a drain connected to a source of the fourth N-type transistor.

12. The asymmetric NAND gate circuit of claim 11, wherein the first N-type transistor comprises a gate to which an enable signal is input, wherein the second N-type transistor comprises a gate to which a scan enable signal is input, and wherein the third N-type transistor comprises a gate connected to a third node.

13. An integrated circuit comprising:

a first clock gating cell configured to receive a clock signal and output a first output clock signal according to a first enable signal; and at least one first flip-flop configured to receive the first output clock signal, wherein the first clock gating cell comprises:

an inverter circuit configured to invert the clock signal to generate an inverted clock signal;

a first control circuit configured to receive the inverted clock signal, the first enable signal and a scan enable signal, and output a first internal signal;

a second control circuit configured to receive the first internal signal, the clock signal, the first enable signal and the scan enable signal, and output a second internal signal; and an output driver configured to receive the second internal signal and output the first output clock signal to an output node, and wherein the output driver is configured to provide a third internal signal to the first control circuit and the second control circuit.

14. The integrated circuit of claim 13, further comprising:

a second clock gating cell configured to receive the clock signal and output a second output clock signal according to a second enable signal; and at least one second flip-flop configured to receive the second output clock signal.

15. The integrated circuit of claim 14, wherein the second clock gating cell is an asymmetric NAND gate circuit comprising an inverter circuit, a first control circuit, a second control circuit, and an output driver.

16. The integrated circuit of claim 13, wherein the first control circuit comprises:

a first P-type transistor comprising a gate to which the scan enable signal is input;

a second P-type transistor comprising a gate to which the first enable signal is input and a source connected to a drain of the first P-type transistor;

a third P-type transistor comprising a gate to which the third internal signal is input and a source connected to a drain of the second P-type transistor;

a fourth P-type transistor comprising a source to which a power supply voltage is applied and a drain connected to a drain of the third P-type transistor;

a fifth P-type transistor comprising a gate to which the inverted clock signal is input, a source connected to the drain of the third P-type transistor, and a drain connected to an internal node;

a first N-type transistor comprising a gate to which the inverted clock signal is input and a drain connected to the internal node;

a second N-type transistor comprising a gate to which the third internal signal is input and a drain connected to the internal node; and a first inverter circuit comprising an input terminal connected to the internal node.

17. The integrated circuit of claim 16, wherein a gate of the fourth P-type transistor is connected to an output terminal of the first inverter circuit, and the first internal signal is output at an output terminal of the first inverter circuit.

18. The integrated circuit of claim 13, wherein the second control circuit comprises:

a first P-type transistor comprising a gate to which the first internal signal is input and a source to which a power supply voltage is applied;

a second P-type transistor comprising a gate to which the clock signal is input and a source to which the power supply voltage is applied;

a first N-type transistor, a second N-type transistor and a third N-type transistor that are connected to each other in parallel, each of the first N-type transistor, the second N-type transistor and the third N-type transistor comprising a drain connected to a drain of the first P-type transistor and a drain of the second P-type transistor;

a fourth N-type transistor comprising a gate to which the clock signal is input and a drain connected to a source of the first N-type transistor; and a fifth N-type transistor comprising a gate to which the first internal signal is input and a drain connected to a source of the fourth N-type transistor.

19. The integrated circuit of claim 13, wherein the output driver comprises:

a second inverter circuit configured to receive the second internal signal and output the first output clock signal; and a third inverter circuit configured to receive the second internal signal and output the third internal signal.

20. The integrated circuit of claim 13, wherein the second control circuit comprises:

a first P-type transistor comprising a gate to which the clock signal is input and a source to which a power supply voltage is applied;

a first N-type transistor, a second N-type transistor and a third N-type transistor that connected to each other in parallel;

a fourth N-type transistor comprising a gate to which the first internal signal is input and a source to which a ground voltage is applied; and a transmission gate circuit connected between a drain of the first P-type transistor and a drain of the first N-type transistor, and configured to be switched by the clock signal and the inverted clock signal.

* * * * *